US010636663B2

United States Patent
Fujii et al.

(10) Patent No.: US 10,636,663 B2
(45) Date of Patent: Apr. 28, 2020

(54) METHOD OF MANUFACTURING SEMICONDUCTOR DEVICE INCLUDING IMPLANTING IMPURITIES INTO AN IMPLANTED REGION OF A SEMICONDUCTOR LAYER AND ANNEALING THE IMPLANTED REGION

(71) Applicant: TOYODA GOSEI CO., LTD., Kiyosu-shi (JP)

(72) Inventors: Takahiro Fujii, Kiyosu (JP); Masayoshi Kosaki, Kiyosu (JP); Takaki Niwa, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 19 days.

(21) Appl. No.: 15/914,046

(22) Filed: Mar. 7, 2018

(65) Prior Publication Data
US 2018/0286684 A1 Oct. 4, 2018

(30) Foreign Application Priority Data

Mar. 29, 2017 (JP) ................. 2017-065017
Mar. 29, 2017 (JP) ................. 2017-065018

(51) Int. Cl.
| | |
|---|---|
| H01L 21/265 | (2006.01) |
| H01L 21/266 | (2006.01) |
| H01L 21/324 | (2006.01) |
| H01L 21/02 | (2006.01) |
| H01L 29/20 | (2006.01) |
| H01L 29/207 | (2006.01) |
| H01L 29/872 | (2006.01) |
| H01L 29/78 | (2006.01) |

(Continued)

(52) U.S. Cl.
CPC .... *H01L 21/26546* (2013.01); *H01L 21/0254* (2013.01); *H01L 21/0262* (2013.01);
(Continued)

(58) Field of Classification Search
None
See application file for complete search history.

(56) References Cited

U.S. PATENT DOCUMENTS

2002/0113249 A1 8/2002 Hori et al.
2006/0202215 A1* 9/2006 Wierer, Jr. .............. H01L 33/32
257/94
(Continued)

FOREIGN PATENT DOCUMENTS

JP 2004-356257 A 12/2004
JP 5358955 B2 12/2004
(Continued)

OTHER PUBLICATIONS

Japanese Office Action dated Mar. 10, 2020, in Japanese Patent Application No. 2017-065017 with an English translation.
(Continued)

*Primary Examiner* — Andres Munoz
(74) *Attorney, Agent, or Firm* — McGinn IP Law Group, PLLC

(57) ABSTRACT

A technique that recovers from degradation in crystalline nature in an ion-implanted region is provided. A method of manufacturing a semiconductor device, includes: an ion implantation step of ion-implanting p-type impurities by a cumulative dose D into an n-type semiconductor layer containing n-type impurities; and a thermal annealing step of annealing an ion-implanted region of the n-type semiconductor layer where the p-type impurities are ion-implanted, in an atmosphere containing nitrogen, at a temperature T for a time t, wherein the cumulative dose D, the temperature T, and the time t satisfy a predetermined relationship.

8 Claims, 16 Drawing Sheets

(51) Int. Cl.
*H01L 29/66* (2006.01)
*H01L 29/861* (2006.01)
*H01L 29/06* (2006.01)
*H01L 29/778* (2006.01)
*H01L 29/423* (2006.01)

(52) U.S. Cl.
CPC ...... *H01L 21/02631* (2013.01); *H01L 21/266* (2013.01); *H01L 21/26553* (2013.01); *H01L 21/26586* (2013.01); *H01L 21/3245* (2013.01); *H01L 29/0619* (2013.01); *H01L 29/2003* (2013.01); *H01L 29/207* (2013.01); *H01L 29/66204* (2013.01); *H01L 29/7813* (2013.01); *H01L 29/8613* (2013.01); *H01L 29/872* (2013.01); *H01L 29/4236* (2013.01); *H01L 29/66734* (2013.01); *H01L 29/7788* (2013.01)

(56) References Cited

U.S. PATENT DOCUMENTS

| | | | |
|---|---|---|---|
| 2010/0147835 A1* | 6/2010 | Mulpuri | C23C 14/025 219/759 |
| 2014/0054680 A1* | 2/2014 | Hashimoto | H01L 21/3242 257/329 |
| 2016/0284563 A1 | 9/2016 | Niwa et al. | |
| 2017/0077830 A1 | 3/2017 | Fujii et al. | |
| 2017/0141270 A1 | 5/2017 | Kaneda et al. | |

FOREIGN PATENT DOCUMENTS

| | | |
|---|---|---|
| JP | 2005-167275 A | 6/2005 |
| JP | 2008-135700 A | 9/2007 |
| JP | 3973938 B2 | 9/2007 |
| JP | 2011-192834 A | 9/2011 |
| JP | 2014-041917 A | 3/2014 |
| JP | 2015-233097 A | 12/2015 |
| JP | 2016-181580 A | 10/2016 |
| JP | 2017-054944 A | 3/2017 |
| JP | 2017-065017 A | 3/2017 |

OTHER PUBLICATIONS

Japanese Office Action dated Mar. 10, 2020, in Japanese Patent Application No. 2017-065018 with an English translation.

* cited by examiner

Fig. 15

| | PREPRODUCTION SAMPLE 1 | PREPRODUCTION SAMPLE 2 | PREPRODUCTION SAMPLE 3 | PREPRODUCTION SAMPLE 4 |
|---|---|---|---|---|
| first THERMAL ANNEALING STEP | 1200°C, 1sec. | 1250°C, 30sec. | 1300°C, 1sec. | 1300°C, 30sec. |
| AFM IMAGE AFTER 1 THERMAL ANNEALING STEP | | | | |
| HOLE CONCENTRATION PIT DENSITY | $3.0 \times 10^{16} cm^{-3}$ $> 10^{10} cm^{2}$ | $2.7 \times 10^{17} cm^{-3}$ $> 10^{10} cm^{2}$ | $1.0 \times 10^{16} cm^{-3}$ $> 10^{10} cm^{2}$ | $6.3 \times 10^{15} cm^{-3}$ $> 10^{10} cm^{2}$ |
| second THERMAL ANNEALING STEP | 900°C, 60min. | | | |
| AFM IMAGE AFTER 2 THERMAL ANNEALING STEP | | | | |
| HOLE CONCENTRATION PIT DENSITY | $3.2 \times 10^{16} cm^{-3}$ $0 cm^{2}$ | $3.2 \times 10^{17} cm^{-3}$ $0 cm^{2}$ | $1.2 \times 10^{16} cm^{-3}$ $7.5 \times 10^{7} cm^{2}$ | $7.2 \times 10^{15} cm^{-3}$ $2.5 \times 10^{9} cm^{2}$ |

Fig. 16
| | PREPRODUCTION SAMPLE 2 | PREPRODUCTION SAMPLE 5 |
|---|---|---|
| first THERMAL ANNEALING STEP | 1250°C、30sec. | |
| AFM IMAGE AFTER 1 THERMAL ANNEALING STEP | 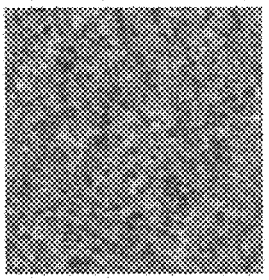 | |
| HOLE CONCENTRATION PIT DENSITY | $2.7 \times 10^{17} cm^{-3}$<br>$> 10^{10} cm^2$ | |
| second THERMAL ANNEALING STEP | 900°C、60min. | |
| AFM IMAGE AFTER 2 THERMAL ANNEALING STEP | 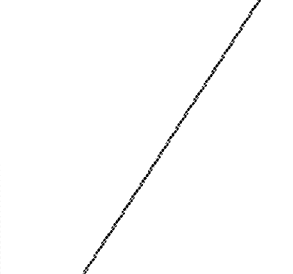 | 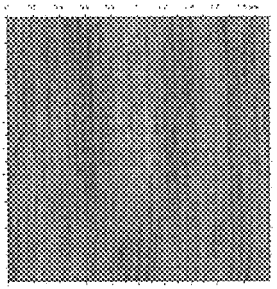 |
| HOLE CONCENTRATION PIT DENSITY | $3.2 \times 10^{17} cm^{-3}$<br>$0 cm^2$ | $0 cm^{-3}$<br>$0 cm^2$ |

METHOD OF MANUFACTURING SEMICONDUCTOR DEVICE INCLUDING IMPLANTING IMPURITIES INTO AN IMPLANTED REGION OF A SEMICONDUCTOR LAYER AND ANNEALING THE IMPLANTED REGION

CROSS-REFERENCE TO RELATED APPLICATION

This application claims priority to Japanese Patent Application No. 2017-065017 filed on Mar. 29, 2017 and Japanese Patent Application No. 2017-065018 filed on Mar. 29, 2017, the entire contents of which are incorporated by reference herein.

BACKGROUND

Technical Field

The present disclosure relates to a method of manufacturing a semiconductor device.

Related Art

Conventionally, a technique of forming a p-type semiconductor region on group-III nitride semiconductor, such as gallium nitride (GaN), through ion implantation has been known. Japanese Patent Laid-Open Nos. 2004-356257 and 2016-181580, and Japanese Patent No. 5358955 describe methods of ion-implanting p-type impurities into a semiconductor layer and subsequently applying thermal annealing in order to recover the crystalline nature in the ion-implanted region, as a method of forming a p-type semiconductor region.

Conventionally, a technique of forming a p-type semiconductor region on group-III nitride semiconductor, such as gallium nitride (GaN), through ion implantation has been known. Japanese Patent Laid-Open Nos. 2004-356257 and 2016-181580, and Japanese Patent No. 5358955 describe methods of ion-implanting p-type impurities into a semiconductor layer and subsequently applying thermal annealing in order to increase the hole concentration, as methods of forming a p-type semiconductor region.

Unfortunately, in general, degradation in crystalline nature due to ion implantation is severe. The conventional methods have a possibility that the degradation in crystalline nature in the ion-implanted region cannot be sufficiently recovered even after the thermal annealing. There is another problem in that incapability of sufficiently recovering from the degradation in crystalline nature in the ion-implanted region increases the leakage current in the semiconductor device. Accordingly, a method of sufficiently recovering from degradation in crystalline nature in the ion-implanted region has been required.

The formation of the p-type semiconductor region through ion implantation possibly causes a problem that the roughness of the surface of the ion-implanted semiconductor layer negates atomic steps on the surface of the semiconductor layer. This negation possibly degrades the crystalline nature of a semiconductor layer to be formed on the existing semiconductor layer. The application of the thermal annealing separates some constituent atoms of the semiconductor layer on the surface of the semiconductor layer, thereby possibly forming holes (hereinafter called "pits") on the semiconductor layer. The pits possibly rough the surface of the semiconductor layer and reduce the hole concentration. Accordingly, a method is required that increases the hole concentration while preventing the atomic steps on the surface of the semiconductor layer from being eliminated, and prevents pits in the semiconductor layer from being formed.

SUMMARY

The present disclosure has been made to solve at least some of the problems described above, and can be achieved as the following aspects.

(1) An aspect of the present disclosure provides a method of manufacturing a semiconductor device. A method of manufacturing a semiconductor device, includes: an ion implantation step of ion-implanting p-type impurities by a cumulative dose D into an n-type semiconductor layer containing n-type impurities; and a thermal annealing step of annealing an ion-implanted region of the n-type semiconductor layer where the p-type impurities are ion-implanted, in an atmosphere containing nitrogen, at a temperature T for a time t, wherein the cumulative dose D [$cm^{-2}$], the temperature T [$°C$], and the time t [min.] satisfy a following formula (1), The method of manufacturing a semiconductor device according to this aspect can recover from the degradation in crystalline nature in the ion-implanted region.

[Formula 1]

$$D \leq \left\{ \frac{t}{9 \times 10^{-34} \times \exp(-0.031 \times T)} \right\}^{0.3} \quad (1)$$

(2) In the manufacturing method described above, the p-type impurities may include at least one selected from the group consisting of magnesium, beryllium, and calcium.
(3) In the manufacturing method described above, an implantation temperature of the ion implantation step may range from 20° C. to 900° C.
(4) In the manufacturing method described above, an implantation angle in the ion implantation step may range from 0° to 15°.
(5) In the manufacturing method described above, a nitrogen source in the thermal annealing step may be of at least one selected from the group consisting of nitrogen, ammonia, and hydrazine.
(6) In the manufacturing method described above, a pressure in the thermal annealing step may range from 10 to 110 kPa.
(7) Another aspect of the present disclosure provides a method of manufacturing a semiconductor device. The method of manufacturing a semiconductor device, includes: an ion implantation step of ion-implanting p-type impurities into an n-type semiconductor layer containing n-type impurities; a first thermal annealing step of annealing an ion-implanted region in which the p-type impurities are ion-implanted and which is covered with a cap layer, in an atmosphere containing nitrogen; and a second thermal annealing step of annealing the ion-implanted region while the ion-implanted region is in a state of being exposed, in an atmosphere that contains hydrazine and at least one of ammonia and hydrazine, after the first thermal annealing step, wherein a cumulative dose in the ion implantation step ranges from $1.0 \times 10^{13}$ to $5.0 \times 10^{15}$ $cm^{-2}$, and a thermal annealing temperature in the first thermal annealing step ranges from 1,150° C. to 1,250° C. The method of manufacturing a semiconductor device according to this aspect can increase the hole concentration while preventing the atomic steps on the surface of the semiconductor layer from being eliminated, and prevent pits in the semiconductor layer from being formed.

(8) In the manufacturing method described above, a thermal annealing time in the first thermal annealing step may range from 1 sec. to 10 min.

(9) In the manufacturing method described above, a pressure in the first thermal annealing step may range from 10 to 110 kPa.

(10) In the manufacturing method described above, a thermal annealing temperature in the second thermal annealing step may range from 850° C. to 1,000° C.

(11) In the manufacturing method described above, a thermal annealing time in the second thermal annealing step may range from 30 to 90 min.

(12) In the manufacturing method described above, a pressure in the second thermal annealing step may range from 10 to 110 kPa.

(13) In the manufacturing method described above, the cap layer that covers the ion-implanted region in the first thermal annealing step may be made of at least one selected from the group consisting of aluminum nitride, silicon nitride, silicon dioxide, and aluminum oxide.

(14) In the manufacturing method described above, in the ion implantation step, the p-type impurities may include at least one of magnesium, calcium, and beryllium.

(15) In the manufacturing method described above, an implantation temperature in the ion implantation step may range from 20 to 900° C.

(16) In the manufacturing method described above, an implantation angle in the ion implantation step may range from 0° to 15°.

(17) The manufacturing method described above may further comprise a step of forming a p-type semiconductor layer containing p-type impurities on the ion-implanted region by at least one of metal organic chemical vapor deposition and molecular beam epitaxy, after the second thermal annealing step.

The present disclosure can be realized in various aspects other than the aspect of the method of manufacturing a semiconductor device. For example, the present disclosure can be realized as an aspect of a semiconductor device manufactured using the manufacturing method described above, and an aspect of an apparatus for manufacturing a semiconductor device using the manufacturing method described above.

The method of manufacturing a semiconductor device according to the disclosure of the present application can recover from the degradation in crystalline nature in the ion-implanted region.

The method of manufacturing a semiconductor device according to the disclosure of the present application can increase the hole concentration while preventing the atomic steps on the surface of the semiconductor layer from being eliminated, and prevent pits in the semiconductor layer from being formed.

BRIEF DESCRIPTION OF THE DRAWINGS

FIG. 15 is a diagram showing results of evaluation tests; and

FIG. 16 is a diagram showing results of evaluation tests.

DETAILED DESCRIPTION OF THE PREFERRED EMBODIMENTS

A. First Embodiment

A-1. Configuration of Semiconductor Device

Figure 1:
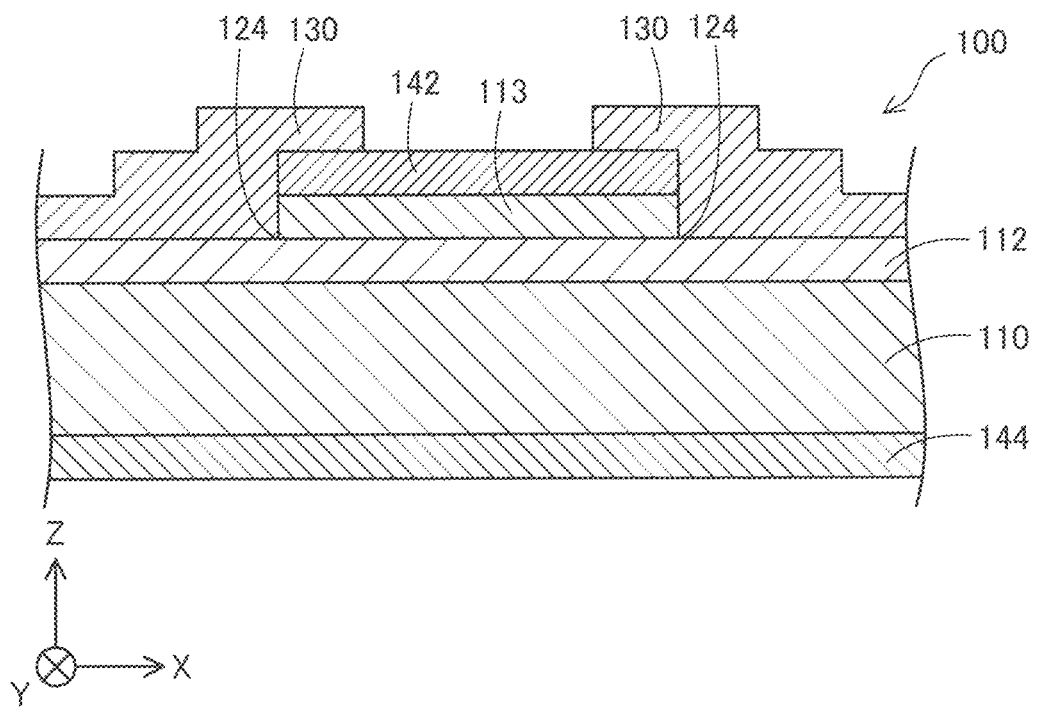
FIG. 1 is a sectional view schematically showing a configuration of a semiconductor device according to a first embodiment.

FIG. 1 is a sectional view schematically showing a configuration of a semiconductor device 100 according to a first embodiment. FIG. 1 shows XYZ-axes that are orthogonal to each other. The X-axis among the XYZ axes in FIG. 1 is an axis extending from the left on the sheet to the right on the sheet of FIG. 1. The +X-axis direction is a direction extending to the right on the sheet, while the −X-axis direction is a direction extending to the left on the sheet. The Y-axis among the XYZ axes in FIG. 1 is an axis extending from the front side on the sheet to the far side on the sheet of FIG. 1. The +Y-axis direction is a direction extending to the far side on the sheet, while the −Y-axis direction is a direction extending to the front side on the sheet. The Z-axis among the XYZ axes in FIG. 1 is an axis extending upward from the bottom of the sheet of FIG. 1. The +Z-axis direction is a direction extending upward on the sheet, while the −Z-axis direction is a direction extending downward on the sheet. The XYZ-axes in FIG. 1 correspond to the respective XYZ-axes in other diagrams.

In this embodiment, the semiconductor device 100 is a GaN semiconductor device formed using gallium nitride (GaN). In this embodiment, the semiconductor device 100 is a vertical p-n junction diode. In this embodiment, the semiconductor device 100 is used for power control.

The semiconductor device 100 includes a substrate 110, an n-type semiconductor layer 112, and a p-type semiconductor region 113. The semiconductor device 100 includes a concave 124 that is a structure formed in the semiconductor layer. The semiconductor device 100 further includes insulating films 130, an anode electrode 142, and a cathode electrode 144.

The substrate 110, the n-type semiconductor layer 112, and the p-type semiconductor region 113 of the semiconductor device 100 are planar semiconductor extending in the X- and Y-axes. In this embodiment, the substrate 110, the n-type semiconductor layer 112, and the p-type semiconductor region 113 are made of group-III nitride semiconductor. Examples of group-III nitride semiconductor include, for example, gallium nitride (GaN), aluminum nitride (AlN), aluminum gallium nitride (AlGaN), indium gallium nitride (InGaN), and indium aluminum gallium nitride (InAlGaN). In view of use for a semiconductor device for power control, it is preferable that the group-III nitride semiconductor be any of gallium nitride (GaN) and aluminum gallium nitride (AlGaN). In this embodiment, gallium nitride (GaN) is adopted as group-III nitride semiconductor. A part of gallium nitride (GaN) may be replaced with another group-III element, such as aluminum (Al) or indium (In), or other impurities may be contained, within a scope where the advantageous effects of this embodiment are exerted.

The substrate 110 of the semiconductor device 100 is made of semiconductor having n-type characteristics. In this embodiment, the concentration of silicon (Si) contained in the substrate 110 is $1 \times 10^{18}$ cm$^{-3}$ or higher. In this embodiment, the thickness of the substrate 110 (the length in the Z-axis direction) ranges from 100 to 500 µm, inclusive.

The n-type semiconductor layer 112 of the semiconductor device 100 is made of semiconductor having n-type characteristics. In this embodiment, the n-type semiconductor layer 112 is disposed on the +Z-axis direction side of the substrate 110. In this embodiment, the concentration of silicon (Si) contained in the n-type semiconductor layer 112 is $1 \times 10^{16}$ cm$^{-3}$. In this embodiment, the thickness of the n-type semiconductor layer 112 (the length in the Z-axis direction) ranges from 10 to 20 µm, inclusive.

The p-type semiconductor region 113 of the semiconductor device 100 is a region formed by ion implantation into the surface (the surface on the +Z-axis direction side) of the n-type semiconductor layer 112. The p-type semiconductor region 113 is also called an ion-implanted region 113. The semiconductor in the p-type semiconductor region 113 has p-type characteristics. In this embodiment, the p-type semiconductor region 113 contains magnesium (Mg) as an acceptor element (p-type impurities). In this embodiment, the concentration of magnesium (Mg) in the p-type semiconductor region 113 ranges from $1 \times 10^{18}$ to $5 \times 10^{19}$ cm$^{-3}$, inclusive. In this embodiment, the thickness of the p-type semiconductor region 113 (the length in the Z-axis direction) ranges from 0.1 to 1.0 µm, inclusive.

In the p-type semiconductor region 113, the half width of the diffraction peak of (0002) plane through omega (ω) degree scan in X-ray diffraction measurement is 100 arcsec or less. Preferably, this degree is 60 arcsec or less.

A concave 124 of the semiconductor device 100 is a groove that penetrates from the surface of the p-type semiconductor region 113 (the surface on the +Z-axis direction side) through this p-type semiconductor region 113 and reaches the n-type semiconductor layer 112. In this embodiment, the concave 124 is formed by dry-etching the p-type semiconductor region 113 and the n-type semiconductor layer 112. The concave 124 allows the p-type semiconductor region 113 to have a mesa shape that has a surface and sides.

The anode electrode 142 of the semiconductor device 100 is formed on the p-type semiconductor region 113. The anode electrode 142 is an electrode in Ohmic contact with the p-type semiconductor region 113. In this embodiment, the anode electrode 142 is an electrode formed by applying a thermal annealing to a layer made of palladium (Pd).

The insulating films 130 of the semiconductor device 100 is films that are formed on the n-type semiconductor layer 112 and the anode electrode 142 and are electrically insulative. In this embodiment, the insulating films 130 are in contact with parts of the surface of the n-type semiconductor layer 112 and parts of the surface of the anode electrode 142, and with the side surfaces of the p-type semiconductor region 113 and the side surfaces of the anode electrode 142. In this embodiment, the insulating film 130 is made of silicon dioxide (SiO$_2$).

The cathode electrode 144 of the semiconductor device 100 is an electrode that is in Ohmic contact with the back surface of the substrate 110, which is the surface on the −Z-axis direction side. In this embodiment, the cathode electrode 144 is an electrode formed by stacking a layer made of aluminum (Al) on a layer made of titanium (Ti) and subsequently applying a thermal annealing.

A-2. Method of Manufacturing Semiconductor Device

Figure 2:
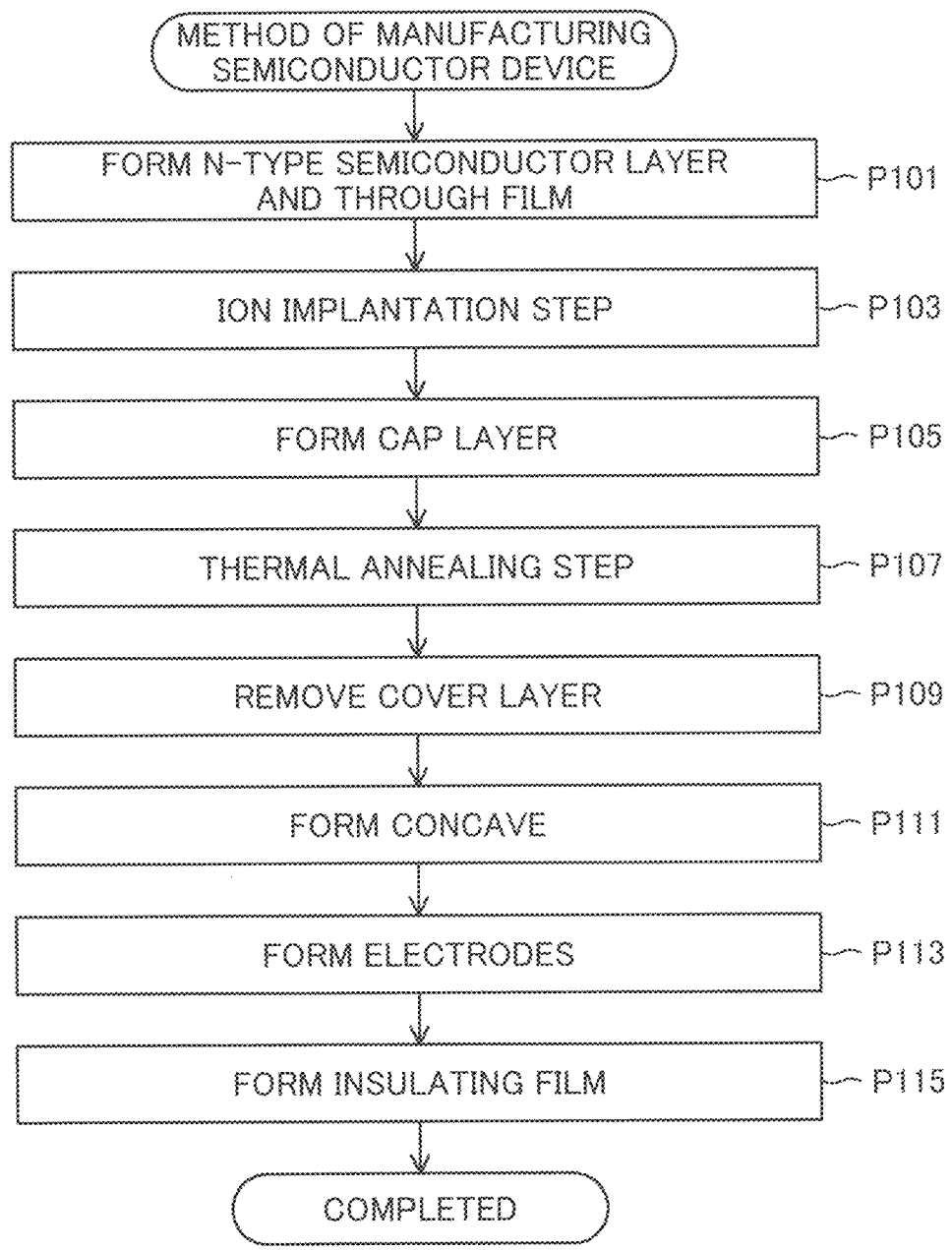
FIG. 2 is a flowchart showing the method of manufacturing the semiconductor device according to the first embodiment.

FIG. 2 is a flowchart showing a method of manufacturing the semiconductor device 100 according to the first embodiment. In step P101, a manufacturer prepares the substrate 110, and subsequently forms the n-type semiconductor layer 112 and a through film on the substrate 110 sequentially in this order. In an ion implantation step described later, the through film is used to adjust the concentration distribution of the p-type impurities that are to be implanted into the n-type semiconductor layer 112. The n-type semiconductor layer 112 and the through film are formed by metal organic chemical vapor deposition (MOCVD). Sequential formation of the n-type semiconductor layer 112 and the through film can prevent contamination between the n-type semiconductor layer 112 and the through film. The through film is made of elements whose principal component is not an element used as donors for group-III nitride semiconductor. Such a configuration can prevent the component elements of the through film from being implanted into the n-type semiconductor layer 112 in the ion implantation step described later. In this embodiment, the through film is made of amorphous aluminum nitride (AlN), and has a thickness of 30 nm.

Next, in step P103, the manufacturer ion-implants p-type impurities, by a cumulative dose D [cm$^{-2}$]satisfying the following formula (1), into the n-type semiconductor layer 112 that contains n-type impurities. Step P103 is also called the ion implantation step.

[Formula 1]

$$D \leq \left\{ \frac{t}{9 \times 10^{-34} \times \exp(-0.031 \times T)} \right\}^{0.3} \quad (1)$$

Here, T is the temperature [° C.] in a thermal annealing step described later, and t is the time [min]. in the thermal annealing step. For example, first, in a case where the temperature T is set to 1,250° C. and the time t is set to 0.1 min. [6 sec.], the right hand side of the formula (1) is $4.6 \times 10^{14}$. Accordingly, in the case where the temperature T is 1,250° C. and the time t is 0.1 min. [6 sec.], the cumulative dose D is $4.6 \times 10^{14}$ cm$^{-2}$ or less. On the contrary, first, the required cumulative dose D may be set on the basis of the desired hole concentration, and subsequently, the temperature T and the time t may be set so as to satisfy the formula (1).

The manufacturer controls the amount of p-type impurities that are to be implanted in the ion implantation step, by means of the cumulative dose. The smaller the cumulative dose is, the narrower the half width of the diffraction peak of (0002) plane through omega (ω) degree scan in X-ray diffraction measurement is. That is, the smaller the cumulative dose is, the smaller the defects in the crystal in the ion-implanted region 113 due to ion implantation are.

Preferably, the p-type impurities to be used for ion implantation include at least one selected from the group consisting of magnesium (Mg), beryllium (Be), and calcium (Ca). In this embodiment, magnesium (Mg) is used as p-type impurities. A region which is a part of the n-type semiconductor layer 112 on the surface side (the surface on the +Z-axis direction side) and into which p-type impurities have been implanted is subjected to a thermal annealing described later to become the p-type semiconductor region 113.

Preferably, the cumulative dose ranges from $1.0 \times 10^{14}$ to $1.0 \times 10^{15}$ cm$^{-2}$, inclusive. In this embodiment, the cumulative dose is $1.0 \times 10^{14}$ cm$^{-2}$. Preferably, the implantation temperature in the ion implantation step ranges from 20° to 900° C., inclusive. Preferably, the implantation angle in the ion implantation step ranges from 0° to 15°, inclusive.

Ion implantation into the n-type semiconductor layer 112 in the state where the through film has been formed can appropriately adjust the distribution of concentration of p-type impurities to be implanted into the n-type semiconductor layer 112. In the ion-implanted region, the concentration distribution of implanted impurities is a distribution obtained by totalizing two or more normal distributions in the depth direction (Z-axis direction). The fact that the concentration distribution forms a normal distribution is that the concentration of implanted impurities is maximum at a position apart from an exposed surface by a predetermined distance in the depth direction (Z-axis direction), and the concentration of impurities decreases as the position is apart toward the front or back surface. In a state where the through film with the concentration of magnesium atoms (Mg) being maximum at a predetermined position in proximity to the surface of the n-type semiconductor layer 112 is arranged in the n-type semiconductor layer 112, ion implantation can set the peak of the concentration of impurities in proximity to the surface of the n-type semiconductor layer 112.

In step P105, the manufacturer forms a cap layer on the through film.

Figure 3:
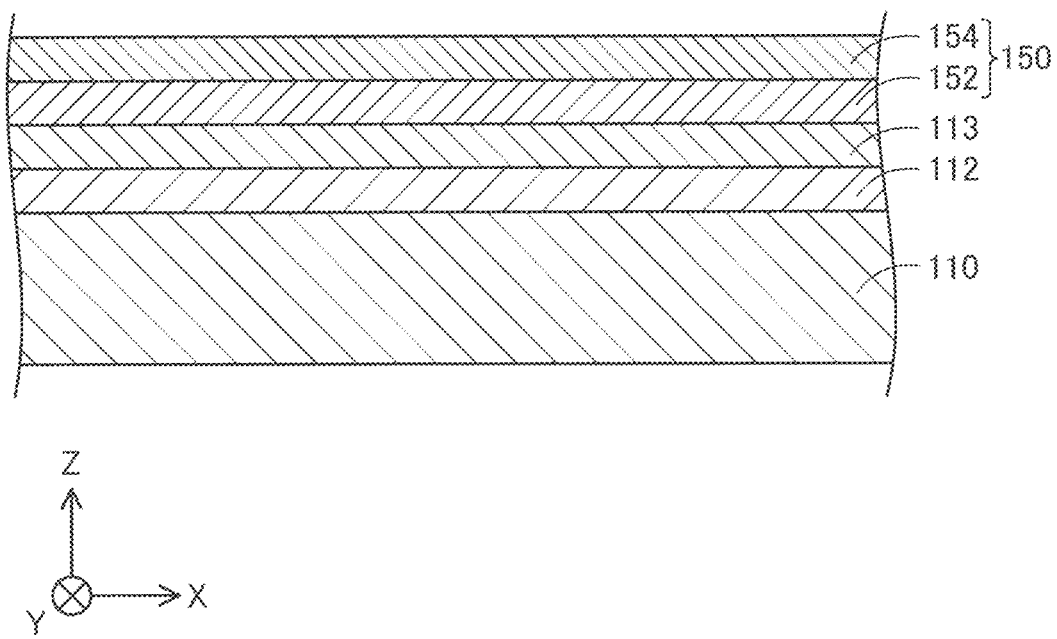
FIG. 3 is a schematic diagram showing a state after formation of a cap layer.

FIG. 3 is a schematic diagram showing a state after formation of the cap layer. In FIG. 3, the cap layer 154 formed on the through film 152 is made of amorphous aluminum nitride (AlN) in this embodiment. In this embodiment, the cap layer 154 is formed by metal organic chemical vapor deposition (MOCVD). Alternatively, the layer may be formed by a sputtering method.

The through film 152 and the cap layer 154 serve as a cap layer 150 that covers the ion-implanted region 113 in a thermal annealing step described later. In this embodiment, the cap layer 150 is made of amorphous aluminum nitride (AlN). In this embodiment, the thickness of the cap layer 154 ranges from 1 to 1,000 nm, inclusive. The cap layer 154 may be, for example, (i) made of aluminum gallium nitride (AlGaN), or (ii) formed by stacking a layer of aluminum nitride (AlN) and a layer of aluminum gallium nitride (AlGaN) in this order by the sputtering method.

Next, in step P107 (see FIG. 2), the manufacturer applies a thermal annealing to the ion-implanted region 113 into which the p-type impurities are ion-implanted, in an atmosphere containing nitrogen (N). Step P107 is also called a thermal annealing step. In a state shown in FIG. 3, the thermal annealing step is executed. In this embodiment, the thermal annealing is applied in the state where the p-type semiconductor region 113 is covered. Alternatively, the thermal annealing may be applied in a state where the p-type semiconductor region 113 is exposed.

The temperature T in the thermal annealing step is a temperature that satisfies the formula (1) described above. Preferably, the temperature T in the thermal annealing step ranges from 800 to 1500° C., inclusive. In this embodiment, the temperature T in the thermal annealing step is 1,250° C. Preferably, the time t in the thermal annealing step ranges from 1 sec. to 10 min., inclusive. More preferably, this time t ranges from 1 sec. to 1 min., inclusive. In this embodiment, the time t in the thermal annealing step is 30 sec. (0.5 min.). Preferably, the pressure in the thermal annealing step ranges from 10 to 110 kPa, inclusive. In this embodiment, the pressure in the thermal annealing step is 100 kPa.

Preferably, the nitrogen source in the thermal annealing step is of at least one selected from the group consisting of nitrogen (N$_2$), ammonia (NH$_3$), and hydrazine (N$_2$H$_4$). The application of the thermal annealing step activates the p-type impurities in the ion-implanted region 113, and achieves a high hole concentration.

Next, in step P109 (see FIG. 2), the manufacturer removes the cap layer 150. In this embodiment, the manufacturer performs wet etching using tetramethylammonium hydroxide (TMAH) at a temperature ranging from 65° C. to 85° C., inclusive, and at pH 12. Instead of wet etching, dry etching may be used.

In step P111, the manufacturer forms the concave 124 through dry etching. Subsequently, in step P113, the manufacturer forms electrodes on the ion-implanted region 113 through at least one of a deposition method and a spattering method. In this embodiment, the manufacturer forms the anode electrode 142 and the cathode electrode 144 on the ion-implanted region 113 through the deposition method.

In step P115, the manufacturer forms the insulating film 130 using at least one selected from the group consisting of silicon dioxide (SiO$_2$), aluminum oxide (Al$_2$O$_3$), and silicon nitride (Si$_3$N$_4$), on the n-type semiconductor layer 112 and the anode electrode 142, through at least one of the spattering method and atomic layer deposition (ALD). In this embodiment, the manufacturer forms the insulating film 130 made of silicon dioxide (SiO$_2$) through atomic layer deposition. Through these steps, the semiconductor device 100 is completed.

A-3. Advantageous Effects

The manufacturing method according to the first embodiment described above includes the ion implantation step (step P103) and the thermal annealing step (step P107), and the cumulative dose D (cm$^{-2}$), the temperature T (° C.) in the thermal annealing step, and the time (min.) in the thermal annealing step satisfy the following formula (1), thereby allowing the crystalline nature in the ion implantation region to be recovered from degradation. The results of evaluation tests that support such an advantageous effect are described below.

[Formula 1]

$$D \leq \left\{ \frac{t}{9 \times 10^{-34} \times \exp(-0.031 \times T)} \right\}^{0.3} \quad (1)$$

A-4. Test Result

A-4-1. First Test Result

Figure 4:
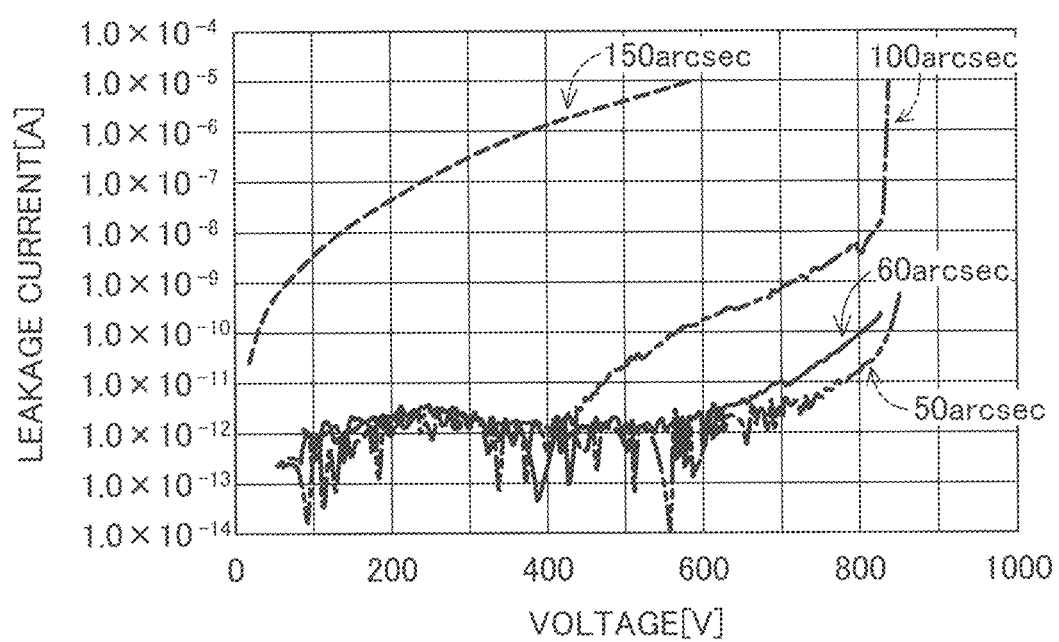
FIG. 4 is a diagram showing results of evaluation tests.

FIG. 4 is a diagram showing results of evaluation tests. A tester fabricated vertical p-n junction diodes that include p-type semiconductor regions 113 with the half widths of GaN (0002) diffraction peaks (hereinafter sometimes simply called "half widths") in omega (ω) degree scan in X-ray diffraction measurement being 150, 100, 60 and 50 arcsec, respectively, through the manufacturing method described above. FIG. 4 shows results of measurement of the leakage current in a case where the voltage is applied to these vertical p-n junction diodes. In FIG. 4, the abscissa axis indicates the voltage (V), and the ordinate axis indicates the leakage current (A). Here, in FIG. 4, the ordinate axis is logarithmically scaled.

The results in FIG. 4 show the followings. That is, the results show that the leakage current of the vertical p-n junction diode having the half width of 150 arcsec is significantly higher than that of the theoretical characteristics. On the other hand, the smaller the half width is, the smaller the leakage current of the vertical p-n junction diode is. The leakage current of the vertical p-n junction diode having a half width of 60 arcsec or less substantially coincides with that of the theoretical characteristics.

Figure 5:
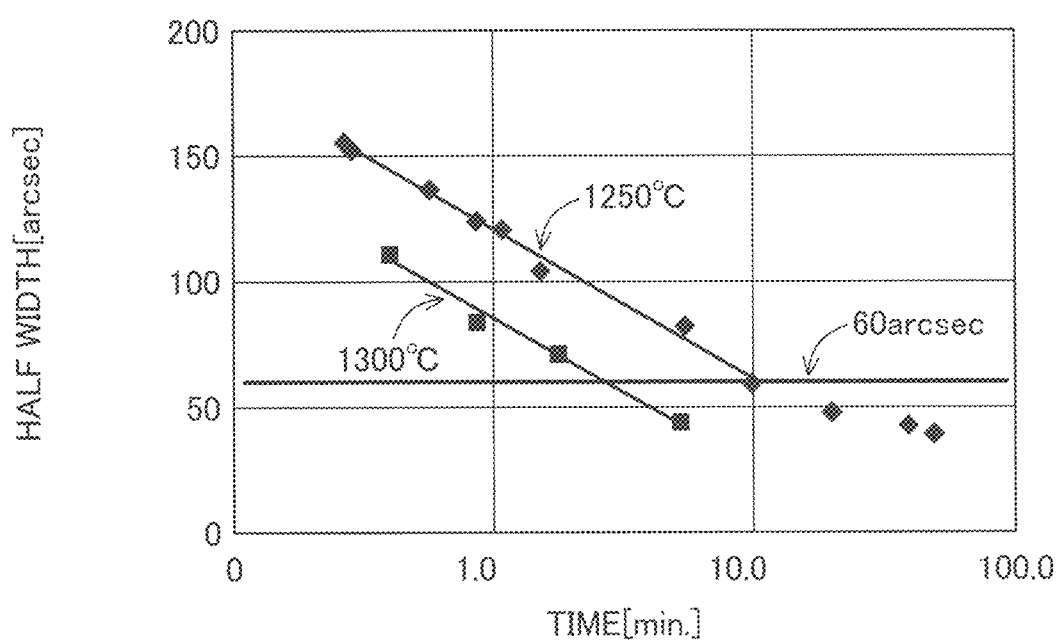
FIG. 5 is a diagram showing a relationship between the time and half width in a thermal annealing step.

FIG. 5 is a diagram showing the relationship between the time t and the half width in the thermal annealing step in a case where the temperature T in the thermal annealing step is changed. In FIG. 5, the abscissa axis indicates the time t [min.] in the thermal annealing step, and the ordinate axis indicates the half width (arcsec). In FIG. 5, the abscissa axis is logarithmically scaled. FIG. 5 shows a result with the temperature T in the thermal annealing step being 1,250° C., and a result with the temperature being 1,300° C. Here, the cumulative dose was $2.3 \times 10^{15}$ cm$^{-2}$. FIG. 5 shows the followings. That is, the diagram shows that as the time t in the thermal annealing step elapses, the half width exponentially decreases. Furthermore, FIG. 5 shows that the time t and the half width in the thermal annealing step can be represented by a linear function, and change in temperature T in the thermal annealing step does not substantially change the slope of the linear function and only changes the intercept of the linear function.

Figure 6:
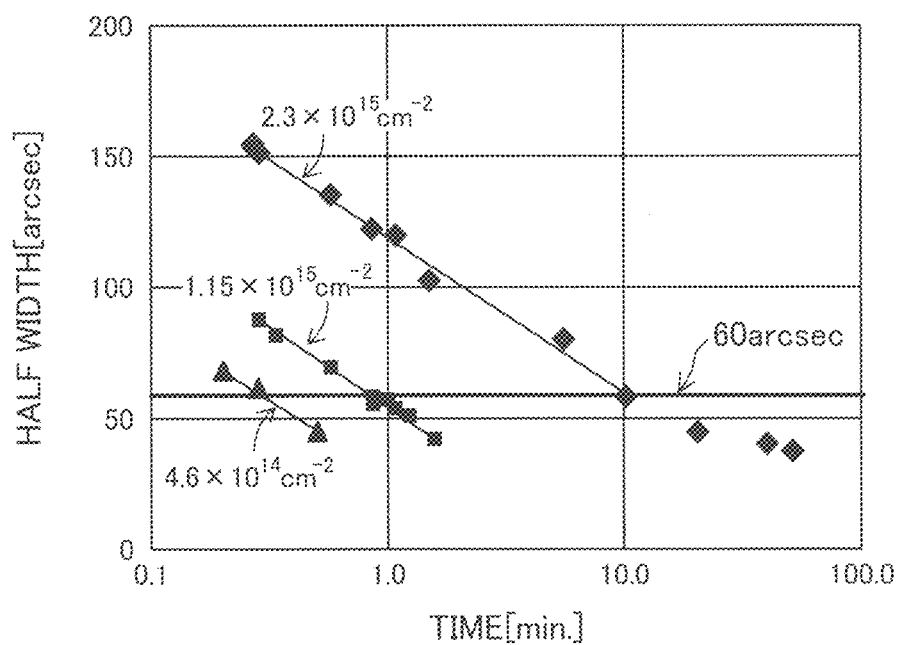
FIG. 6 is a diagram showing a relationship between the time and half width in the thermal annealing step.

FIG. 6 is a diagram showing the relationship between the time t and the half width in the thermal annealing step in a case where the cumulative dose is changed. In FIG. 6, the abscissa axis indicates the time t [min.] in the thermal annealing step, and the ordinate axis indicates the half width (arcsec). In FIG. 6, the abscissa axis is logarithmically scaled. FIG. 6 shows a result with the cumulative dose being (i) $2.3 \times 10^{15}$ cm$^{-2}$, a result with the cumulative dose being (ii) $1.15 \times 10^{15}$ cm$^{-2}$, and a result with the cumulative dose being (iii) $4.6 \times 10^{14}$ cm$^{-2}$. Here, the temperature T in the thermal annealing step is 1,250° C.

FIG. 6 shows the followings. That is, the diagram shows that as the time t in the thermal annealing step elapses, the half width exponentially decreases. Furthermore, FIG. 6 shows that the time t and the half width in the thermal annealing step can be represented by a linear function, and change in cumulative dose does not substantially change the slope of the linear function and only changes the intercept of the linear function.

The results described above show that the cumulative dose D [cm$^{-2}$], the time t [min.] in the thermal annealing step, and the temperature T [° C.] in the thermal annealing step satisfy the relationship of the following formula (2).

[Formula 2]

$$D = \left\{ \frac{t}{9 \times 10^{-34} \times \exp(-0.031 \times T)} \right\}^{0.3} \quad (2)$$

Figure 7:
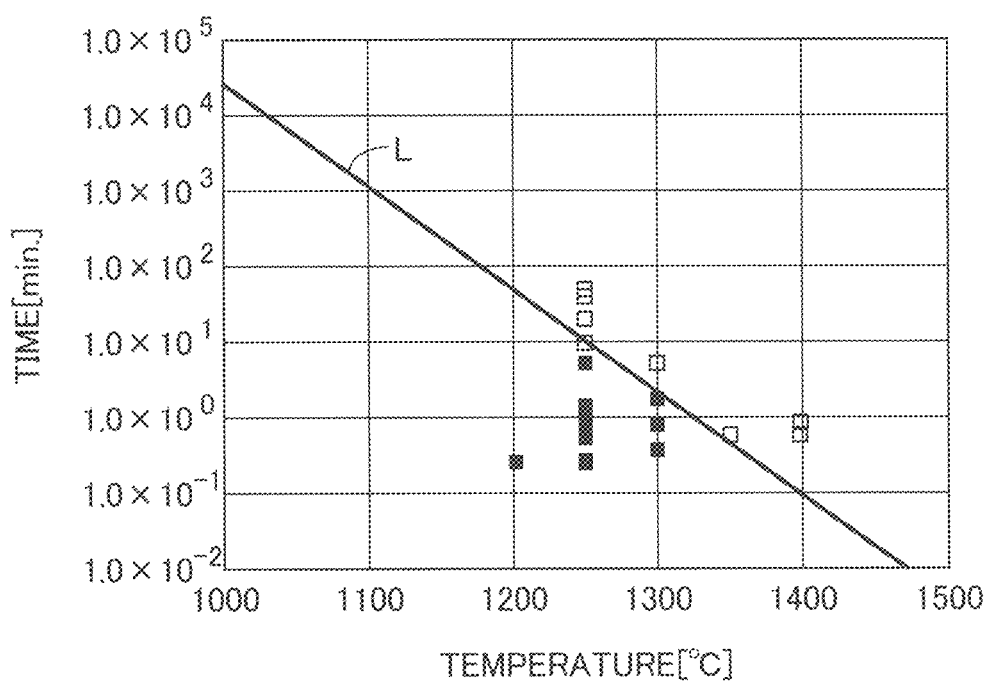
FIG. 7 is a diagram showing a relationship between the temperature in the thermal annealing step and the time in the thermal annealing step.

FIG. 7 is a diagram showing the relationship between the temperature T in the thermal annealing step and the time t in the thermal annealing step. In FIG. 7, the abscissa axis indicates the temperature T [° C.] in the thermal annealing step, and the ordinate axis indicates the time t [min.] in the thermal annealing step. In FIG. 7, the ordinate axis is logarithmically scaled. FIG. 7 shows a result with the cumulative dose being $2.3 \times 10^{15}$ cm$^{-2}$. In FIG. 7, the relational formula of the formula (2) described above is represented by a line L. In FIG. 7, test results of the temperature T and the time t in a thermal annealing condition where the half width is 60 arcsec or less are represented by blank squares, and test results in a thermal annealing condition where the half width is larger than 60 arcsec are represented by filled squares. The results show that the line L representing the relational formula of the formula (2) described above serves as the boundary between the thermal annealing condition indicated by the blank squares and the thermal annealing condition represented by the filled squares, and that the half width is 60 arcsec or less in the case where the relational formula of the following formula (1) is satisfied.

[Formula 1]

$$D \leq \left\{ \frac{t}{9 \times 10^{-34} \times \exp(-0.031 \times T)} \right\}^{0.3} \quad (1)$$

A-4-2. Second Test Results

Figure 8:
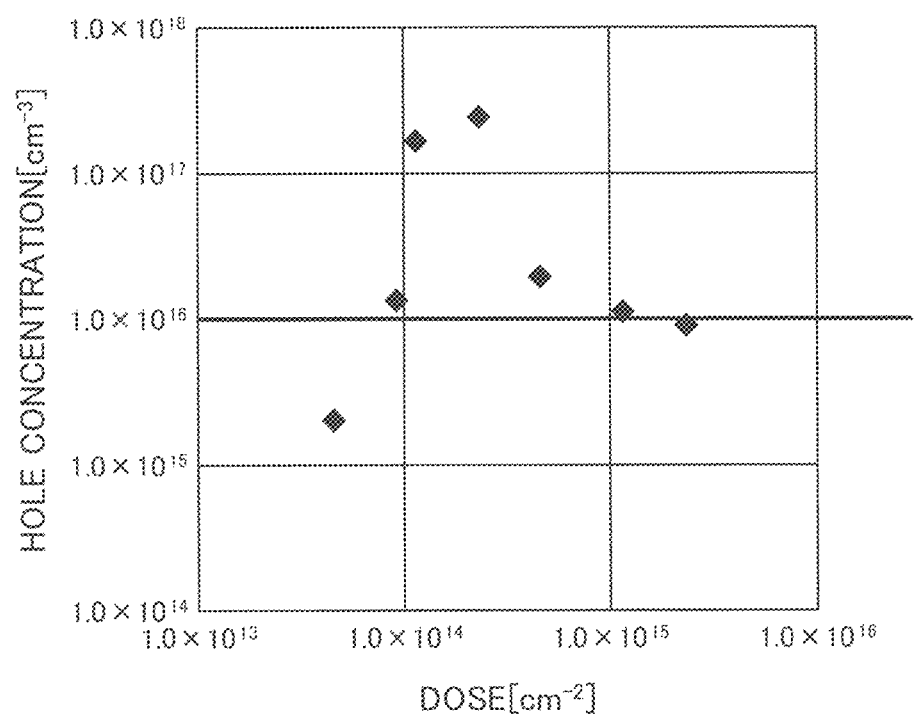
FIG. 8 is a diagram showing a relationship between the cumulative dose in a p-type semiconductor region and the hole concentration.

FIG. 8 is a diagram showing the relationship between the cumulative dose into the p-type semiconductor region 113 and the hole concentration in the ion-implanted region 113 after the thermal annealing step. In FIG. 8, the abscissa axis indicates the cumulative dose [cm$^{-2}$] into the p-type semiconductor region 113, and the ordinate axis indicates the hole concentration [cm$^{-3}$]. In FIG. 8, the ordinate and abscissa axes are logarithmically scaled.

In general, the larger the cumulative dose is, the greater the crystalline degradation in the p-type semiconductor region 113 by the ion implantation is. Accordingly, to recover the crystalline nature in the p-type semiconductor region 113, the time period in the thermal annealing step is required to be long, and the temperature in the thermal annealing step is required to be high. On the contrary, the smaller the cumulative dose is, the lesser the crystalline degradation in the p-type semiconductor region 113 by the ion implantation is. Accordingly, the time period in the thermal annealing step can be short, and the temperature in the thermal annealing step can be low. There is, however, a possibility that a required hole concentration cannot be achieved.

FIG. 8 shows that the hole concentration cannot be high even in a case where the cumulative dose is too large or too small, and also shows that the hole concentration is the maximum with a certain cumulative dose.

Here, in order to achieve the pressure resistance of the p-n junction diode being 600 V or higher, the hole concentration in the ion-implanted region 113 after the thermal annealing step is required to be $1 \times 10^{16}$ cm$^{-3}$ or higher. In FIG. 8, in cases where the cumulative dose ranges from $1.0 \times 10^{14}$ to $1.0 \times 10^{15}$ cm$^{-2}$, inclusive, the hole concentration in the ion-implanted region 113 after the thermal annealing step is $1 \times 10^{16}$ cm$^{-3}$ or higher. Accordingly, it is preferable that the cumulative dose ranges from $1.0 \times 10^{14}$ to $1.0 \times 10^{15}$ cm$^{-2}$, inclusive.

In general, the smaller the half width of the diffraction peak of (0002) plane through omega (ω) degree scan in X-ray diffraction measurement is, the smaller the defects in the crystal in the ion-implanted region are. There is a report that the half width was 150 arcsec or less through epitaxial growth (for example, see Japanese Patent Laid-Open No. 2005-167275). However, there is no report that the half width was 60 arcsec or less in an ion-implanted region. This shows that the manufacturing method in this embodiment sufficiently recovered degradation in crystalline nature in the ion-implanted region.

B. Second Embodiment

Figure 9:
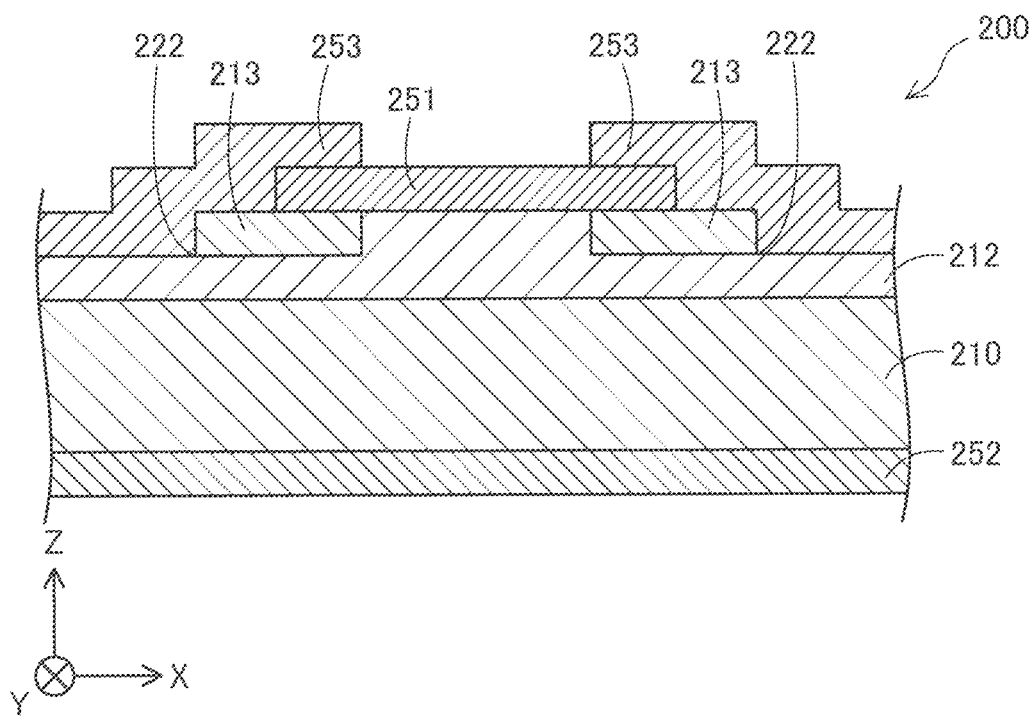
FIG. 9 is a sectional view schematically showing a configuration of a semiconductor device according to a second embodiment.

FIG. 9 is a sectional view schematically showing a configuration of a semiconductor device 200 according to a second embodiment. In this embodiment, the semiconductor device 200 is a GaN semiconductor device formed using gallium nitride (GaN), and is a vertical Schottky barrier diode. In this embodiment, the semiconductor device 200 is used for power control.

The semiconductor device 200 includes a substrate 210, an n-type semiconductor layer 212, and p-type semiconductor regions 213. The semiconductor device 200 includes a concave 222 that is a structure formed in the semiconductor layer. The semiconductor device 200 further includes insulating films 253, an anode electrode 251, and a cathode electrode 252.

As with the first embodiment, the method of manufacturing the semiconductor device 200 of this embodiment also includes (i) an ion implantation step of ion-implanting p-type impurities by the cumulative dose D satisfying the formula (1) described above into the n-type semiconductor layer 212 containing n-type impurities, and (ii) a thermal annealing step of applying a thermal annealing to the p-type semiconductor region 213 into which p-type impurities are ion-implanted in an atmosphere containing nitrogen at the temperature T for time t satisfying the formula (1) described above. Accordingly, the method of manufacturing the semiconductor device 200 according to this embodiment can recover from the degradation in crystalline nature in the ion-implanted region.

The method of manufacturing the semiconductor device 200 of this embodiment further includes, after the thermal annealing step, a step of forming the insulating film 253 using at least one selected from the group consisting of silicon dioxide, aluminum oxide, and silicon nitride, on the n-type semiconductor layer 212 and the p-type semiconductor region 213, which is the ion-implanted region, by at least one of the spattering method and the atomic layer deposition. The p-type semiconductor region 213 has recovered the crystalline nature through the thermal annealing step. Accordingly, the leakage current can be prevented at the interface with the insulating film 253. Consequently, the method of manufacturing the semiconductor device 200 of this embodiment can obtain the favorable semiconductor device.

C. Third Embodiment

Figure 10:
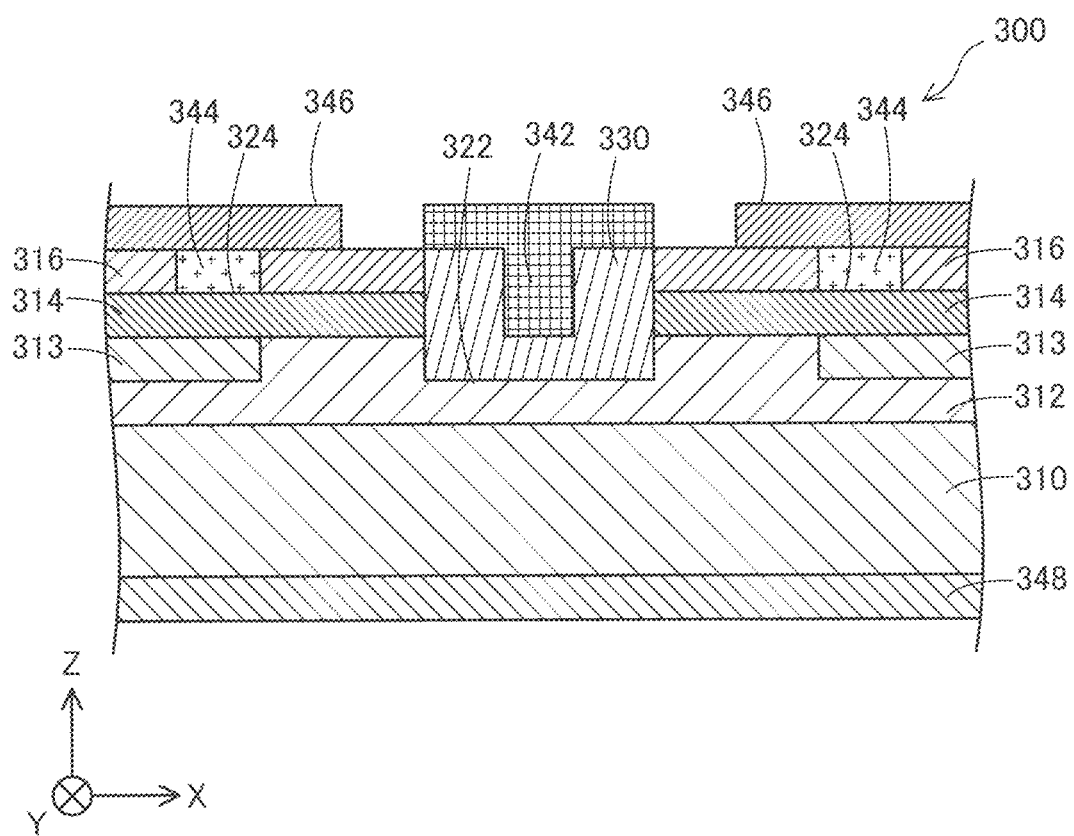
FIG. 10 is a sectional view schematically showing a configuration of a semiconductor device according to a third embodiment.

FIG. 10 is a sectional view schematically showing a configuration of a semiconductor device 300 according to a third embodiment. In this embodiment, the semiconductor device 300 is a GaN semiconductor device formed using gallium nitride (GaN), and is a vertical trench MOSFET (Metal-Oxide-Semiconductor Field-Effect Transistor). In this embodiment, the semiconductor device 300 is used for power control.

The semiconductor device 300 includes a substrate 310, an n-type semiconductor layer 312, p-type semiconductor regions 313, p-type semiconductor layers 314, and n-type semiconductor layers 316. The semiconductor device 300 includes a trench 322, and recesses 324 that are structures formed in the semiconductor layer. The semiconductor device 300 further includes an insulating film 330, a gate electrode 342, body electrodes 344, source electrodes 346, and a drain electrode 348.

As with the first embodiment, the method of manufacturing the semiconductor device 300 of this embodiment also includes (i) an ion implantation step of ion-implanting p-type impurities by the cumulative dose D satisfying the formula (1) described above into the n-type semiconductor layer 312 containing n-type impurities, and (ii) a thermal annealing step of applying a thermal annealing to the p-type semiconductor region 313 into which p-type impurities are ion-implanted in an atmosphere containing nitrogen at the temperature T for the time t satisfying the formula (1) described above. Accordingly, the method of manufacturing the semiconductor device 300 according to this embodiment can recover from the degradation in crystalline nature in the ion-implanted region.

The method of manufacturing the semiconductor device 300 according to this embodiment includes, after the thermal annealing step, a step of forming the p-type semiconductor layers 314 containing p-type impurities on the p-type semiconductor regions 313 that are ion-implanted regions through at least one of the metal organic chemical vapor deposition and molecular beam epitaxy. The crystalline nature of the p-type semiconductor regions 313 are recovered. Accordingly, the crystalline nature of the p-type semiconductor layers 314 formed on the flat surfaces of the p-type semiconductor regions 313 is improved. Consequently, the method of manufacturing the semiconductor device 300 according to this embodiment can obtain a favorable semiconductor device.

D. Fourth Embodiment

D-1. Configuration of Semiconductor Device

Figure 11:
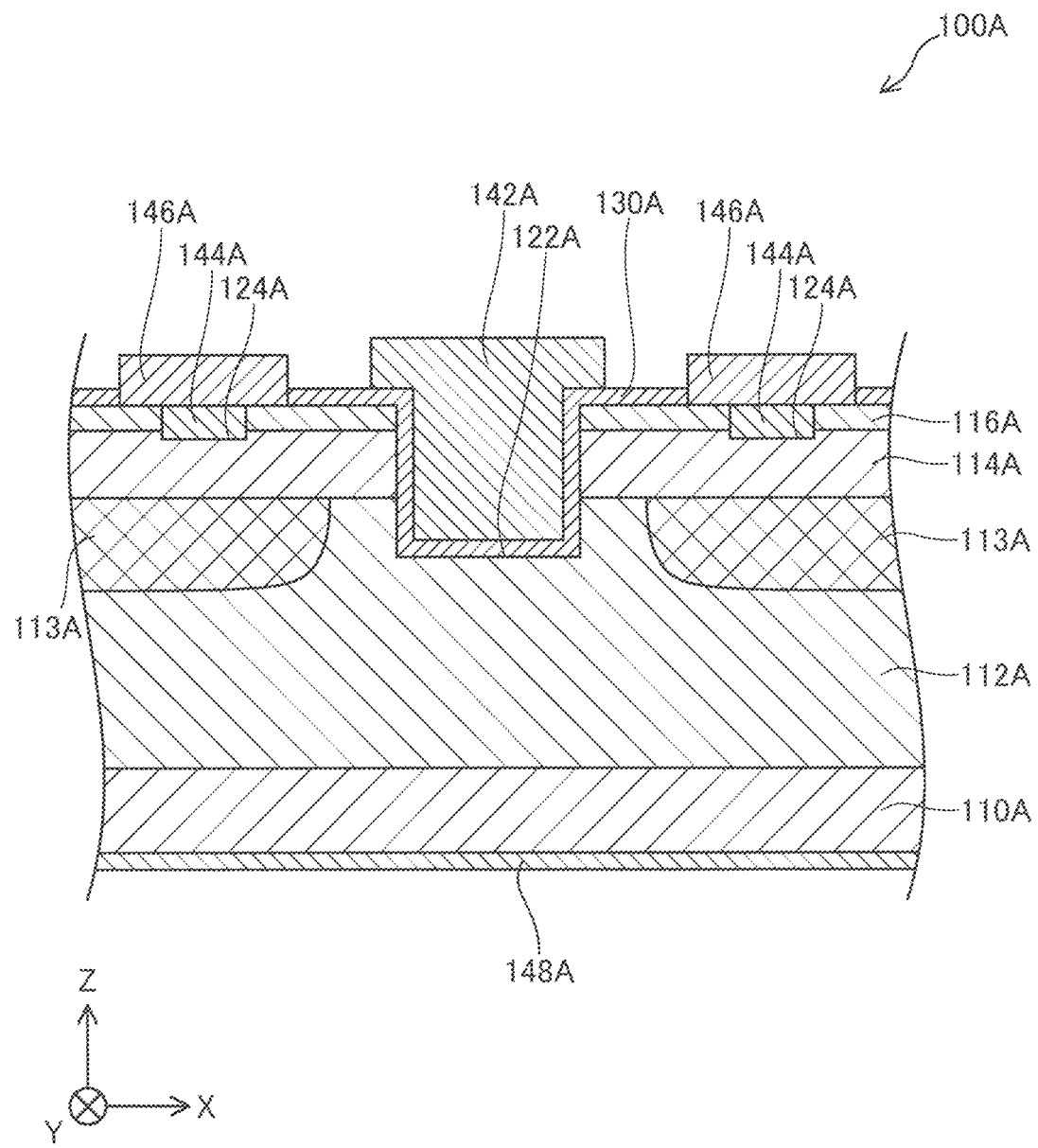
FIG. 11 is a sectional view schematically showing a configuration of a semiconductor device according to a fourth embodiment.

FIG. 11 is a sectional view schematically showing a configuration of a semiconductor device 100A according to a fourth embodiment. FIG. 11 shows XYZ-axes that are orthogonal to each other. The X-axis among the XYZ axes in FIG. 11 is an axis extending from the left on the sheet to the right on the sheet of FIG. 11. The +X-axis direction is a direction extending to the right on the sheet, while the −X-axis direction is a direction extending to the left on the sheet. The Y-axis among the XYZ axes in FIG. 11 is an axis extending from the front side on the sheet to the far side on the sheet of FIG. 11. The +Y-axis direction is a direction extending to the far side on the sheet, while the −Y-axis direction is a direction extending to the front side on the sheet. The Z-axis among the XYZ axes in FIG. 11 is an axis extending upward from the bottom on the sheet of FIG. 11. The +Z-axis direction is a direction extending upward on the sheet, while the −Z-axis direction is a direction extending downward on the sheet. The XYZ-axes in FIG. 11 correspond to the respective XYZ-axes in other diagrams.

In this embodiment, the semiconductor device 100A is a GaN semiconductor device formed using gallium nitride (GaN). In this embodiment, the semiconductor device 100A is a vertical trench MOSFET (Metal-Oxide-Semiconductor Field-Effect Transistor). In this embodiment, the semiconductor device 100A is used for power control, and is also called a power device.

The semiconductor device 100A includes a substrate 110A, an n-type semiconductor layer 112A, p-type semiconductor regions 113A, p-type semiconductor layers 114A, and n-type semiconductor layers 116A. The semiconductor device 100A includes a trench 122A, and recesses 124A that are structures formed in the semiconductor layer. The semiconductor device 100A further includes an insulating film 130A, a gate electrode 142A, body electrodes 144A, source electrodes 146A, and a drain electrode 148A.

The substrate 110A, the n-type semiconductor layer 112A, p-type semiconductor layers 114A, and the n-type semiconductor layers 116A of the semiconductor device 100A are planar semiconductor extending in the X- and Y-axes. In this embodiment, the substrate 110A, the n-type semiconductor layer 112A, the p-type semiconductor layers 114A, and the n-type semiconductor layers 116A are made of group-III nitride semiconductor. Examples of group-III nitride semiconductor include, for example, gallium nitride (GaN), aluminum nitride (AlN), aluminum gallium nitride (AlGaN), indium gallium nitride (InGaN), and indium aluminum gallium nitride (InAlGaN). In view of use for a semiconductor device for power control, it is preferable that the group-III nitride semiconductor be any of gallium nitride (GaN) and aluminum gallium nitride (AlGaN). In this embodiment, gallium nitride (GaN) is adopted as group-III nitride semiconductor. A part of gallium nitride (GaN) may be replaced with another group-III element, such as aluminum (Al) or indium (In), or may include other impurities, within a scope where the advantageous effects of this embodiment are exerted.

The substrate 110A of the semiconductor device 100A is made of semiconductor having n-type characteristics. In this embodiment, the concentration of silicon (Si) contained in the substrate 110A is $1\times10^{18}$ cm$^{-3}$ or higher. In this embodiment, the thickness of the substrate 110A (the length in the Z-axis direction) ranges from 100 to 500 μm, inclusive.

The n-type semiconductor layer 112A of the semiconductor device 100A is made of semiconductor having n-type characteristics. In this embodiment, the n-type semiconductor layer 112A is disposed on the +Z-axis direction side of the substrate 110A. In this embodiment, the concentration of silicon (Si) contained in the n-type semiconductor layer 112A is $1\times10^{16}$ cm$^{-3}$. In this embodiment, the thickness of the n-type semiconductor layer 112A (the length in the Z-axis direction) ranges from 10 to 20 μm, inclusive.

The p-type semiconductor regions 113A of the semiconductor device 100A are regions formed by ion implantation into parts of the n-type semiconductor layer 112A. The p-type semiconductor regions 113A are also called ion-implanted regions 113A. The semiconductor in the p-type semiconductor region 113A has p-type characteristics. There is no pit on the surfaces of the p-type semiconductor regions 113A (the surfaces on the +Z-axis direction side), and atomic steps reside. In this embodiment, the p-type semiconductor regions 113A are formed at positions apart from the trench 122A, and are adjacent to the n-type semiconductor layer 112A and the p-type semiconductor layers 114A. In this embodiment, the p-type semiconductor region 113A contains magnesium (Mg) as an acceptor element (p-type impurities). In this embodiment, the concentration of magnesium (Mg) in the p-type semiconductor region 113A ranges from $1\times10^{18}$ to $5\times10^{19}$ cm$^{-3}$, inclusive. In this embodiment, the thickness of the p-type semiconductor region 113A ranges from 0.1 to 1 μm, inclusive.

The p-type semiconductor layer 114A of the semiconductor device 100A is made of semiconductor having p-type characteristics. In this embodiment, the p-type semiconductor layers 114A are disposed on the +Z-axis direction side of the n-type semiconductor layer 112A and the p-type semiconductor regions 113A. In this embodiment, the p-type semiconductor layers 114A contain magnesium (Mg) as an acceptor element. In this embodiment, the concentration of magnesium (Mg) contained in the p-type semiconductor layer 114A is $4\times10^{18}$ cm$^{-3}$ or less. In this embodiment, the thickness of the p-type semiconductor layers 114A (the length in the Z-axis direction) is 1 μm or less.

The n-type semiconductor layer 116A of the semiconductor device 100A is made of semiconductor having n-type characteristics. In this embodiment, the n-type semiconductor layers 116A are disposed on the +Z-axis direction side of the p-type semiconductor layers 114A. In this embodiment, the n-type semiconductor layers 116A contain silicon (Si) as a donor element. In this embodiment, the concentration of silicon (Si) contained in the n-type semiconductor layers 116A is $1\times10^{18}$ cm$^{-3}$ or higher, and the thickness of the n-type semiconductor layers 116A (the length in the Z-axis direction) is 0.4 μm or less.

The trench 122A of the semiconductor device 100A is a groove that penetrates from the surface of the n-type semiconductor layer 116A on the +Z-axis direction side through this n-type semiconductor layer 116A and the p-type semiconductor layer 114A and reaches the n-type semiconductor layer 112A. In this embodiment, the trench 122A has a structure formed by applying dry etching to the n-type semiconductor layers 116A, the p-type semiconductor layers 114A, and the n-type semiconductor layer 112A.

The recesses 124A of the semiconductor device 100A are concaves that penetrate from the surface of the n-type semiconductor layers 116A on the +Z-axis direction side through the n-type semiconductor layers 116A and the p-type semiconductor layers 114A. In this embodiment, the recesses 124A have structures formed by applying dry etching to the n-type semiconductor layers 116A and the p-type semiconductor layers 114A.

The insulating film 130A of the semiconductor device 100A is a film that is formed in the trench 122A and is electrically insulative. In this embodiment, the insulating film 130A is formed from the inside of the trench 122A to parts of the surfaces of the n-type semiconductor layers 116A on the +Z-axis direction side. In this embodiment, the insulating film 130A is made of silicon dioxide ($SiO_2$).

The gate electrode 142A of the semiconductor device 100A is an electrode formed inside of the trench 122A via the insulating film 130A. In this embodiment, the gate electrode 142A is formed not only at the inside of the trench 122A but also parts of the surfaces of the insulating film 130A in the +Z-axis direction outside of the trench 122A. In this embodiment, the gate electrode 142A is made of aluminum (Al). Application of a voltage to the gate electrode 142A forms inversion layers on the p-type semiconductor layers 114A. The inversion layers function as channels to form respective conductive paths between the source electrodes 146A and drain electrodes 148A.

The body electrodes 144A of the semiconductor device 100A are electrodes that are formed in the respective recesses 124A and are in Ohmic contact with the p-type semiconductor layers 114A. In this embodiment, the body electrodes 144A are electrodes formed by applying a thermal annealing to layers made of palladium (Pd).

The source electrodes 146A of the semiconductor device 100A are electrodes that are in Ohmic contact with the respective n-type semiconductor layers 116A. In this embodiment, the source electrodes 146A are formed on the body electrodes 144A to parts of the surfaces of the n-type semiconductor layers 116A on the +Z-axis direction side. Alternatively, the source electrodes 146A may be formed at sites apart from the body electrodes 144A.

The drain electrode 148A of the semiconductor device 100A is an electrode that is in Ohmic contact with the back surface of the substrate 110A, which is the surface on the −Z-axis direction side. In this embodiment, the drain electrode 148A is an electrode formed by stacking a layer made of aluminum (Al) on a layer made of titanium (Ti) and subsequently applying a thermal annealing.

D-2. Method of Manufacturing Semiconductor Device

Figure 12:
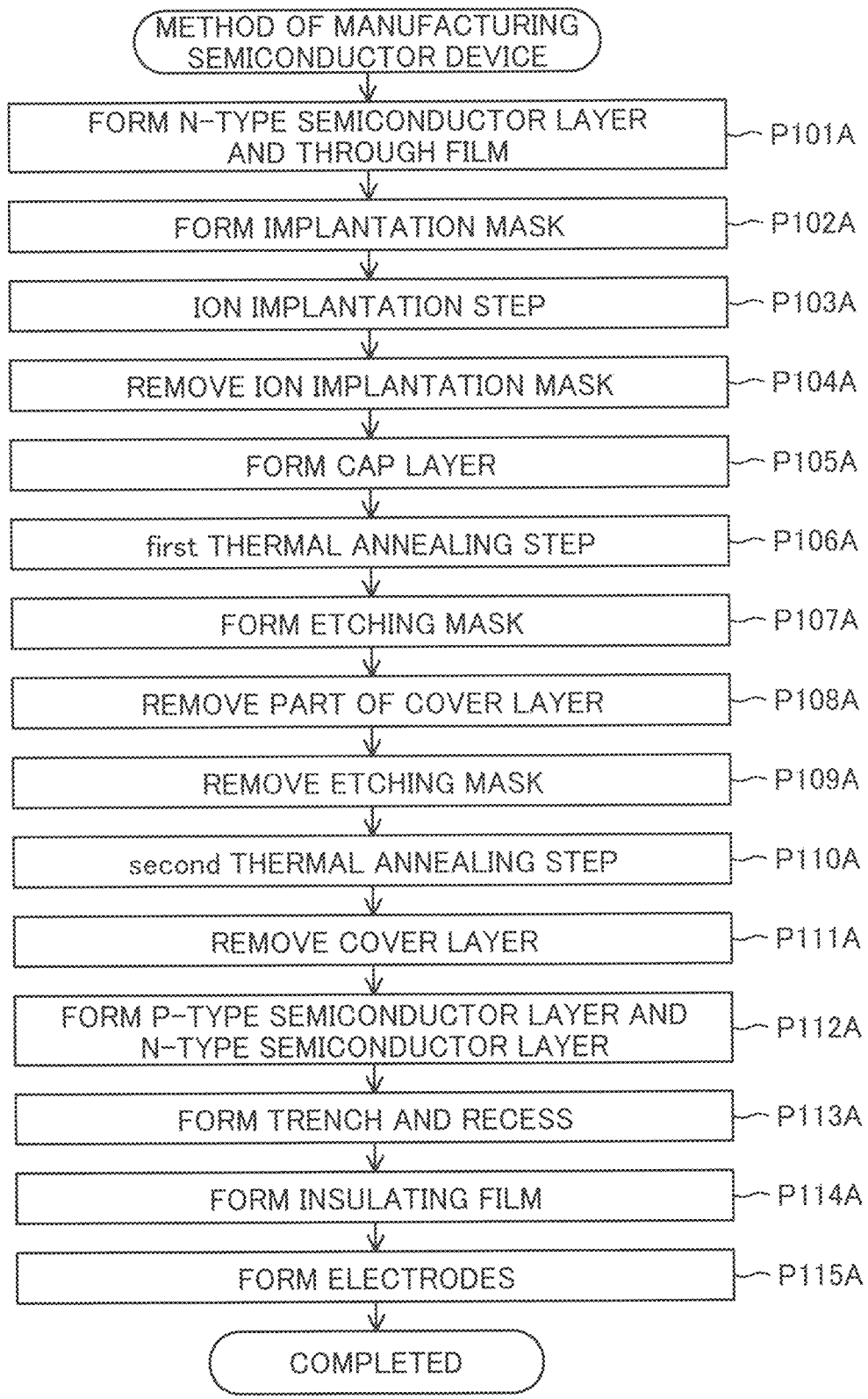
FIG. 12 is a flowchart showing the method of manufacturing the semiconductor device according to the fourth embodiment.

A method of manufacturing a semiconductor device is described with reference to FIGS. 12 to 14. FIG. 12 is a flowchart showing a method of manufacturing the semiconductor device 100A according to the fourth embodiment. In step P101A, a manufacturer prepares the substrate 110A, and subsequently forms the n-type semiconductor layer 112A and a through film on the substrate 110A sequentially in this order. In an ion implantation step described later, the through film is used to adjust the concentration distribution of the p-type impurities that are to be implanted into the n-type semiconductor layer 112A. The n-type semiconductor layer 112A and the through film are formed by metal organic chemical vapor deposition (MOCVD). Sequential formation of the n-type semiconductor layer 112A and the through film can prevent contamination between the n-type semiconductor layer 112A and the through film. The through film is made of elements whose principal component is not an element used as donors for group-III nitride semiconductor. Such a configuration can prevent the component elements of the through film from being implanted into the n-type semiconductor layer 112A in the ion implantation step described later. In this embodiment, the through film is made of amorphous aluminum nitride (AlN), and has a thickness of 30 nm.

In step P102A, the manufacturer forms an ion implantation mask on a part of the through film (on the +Z-axis direction side). In this embodiment, the ion implantation mask is made of photoresist. An opening is provided at a part corresponding to a region to be subjected to ion implantation. Instead of the photoresist, for example, an insulating film, a metal film, or a structure in which an insulating film and a metal film are stacked, are adopted.

Next, in step P103A, the manufacturer ion-implants p-type impurities into the n-type semiconductor layer 112A that contains n-type impurities. Step P103A is also called the ion implantation step. Preferably, the p-type impurities to be used for ion implantation include at least one of magnesium (Mg), calcium (Ca) and beryllium (Be). In this embodiment, magnesium (Mg) is used as p-type impurities. A region which is a part of the n-type semiconductor layer 112A on the surface side (the surface on the +Z-axis direction side) and into which p-type impurities have been implanted is also called an ion-implanted region. The region is subjected to a thermal annealing described later to become the p-type semiconductor region 113A.

The cumulative dose in the ion implantation step ranges from $1.0 \times 10^{13}$ to $5.0 \times 10^{15}$ $cm^{-2}$, inclusive. Preferably, the implantation temperature in the ion implantation step ranges from 20° to 900° C., inclusive. Preferably, the implantation angle in the ion implantation step ranges from 0° to 15°, inclusive.

Ion implantation into the n-type semiconductor layer 112A in the state where the through film has been formed can appropriately adjust the distribution of concentration of p-type impurities to be implanted into the n-type semiconductor layer 112A. In the ion-implanted region, the concentration distribution of implanted impurities is a distribution obtained by totalizing two or more normal distributions in the depth direction (Z-axis direction). The fact that the concentration distribution forms a normal distribution is that the concentration of implanted impurities is maximum at a position apart from an exposed surface by a predetermined distance in the depth direction (Z-axis direction), and the concentration of impurities decreases as the position is apart toward the front or back surface. In a state where the through film with the concentration of magnesium atoms (Mg) being maximum at a predetermined position in proximity to the surface of the n-type semiconductor layer 112A is arranged in the n-type semiconductor layer 112A, ion implantation can set the peak of the concentration of impurities in proximity to the surface of the n-type semiconductor layer 112A.

In step P104A, the manufacturer removes the ion implantation mask. More specifically, the ion implantation mask, which is a photoresist mask, is removed by organic solvent. In the case where an insulating film is used as the ion implantation mask, for example, hydrogen fluoride (HF) or ammonium hydrogen fluoride ($NH_4F$) may be used to remove the ion implantation mask. In the case where a metal film is used as the ion implantation mask, for example, hydrochloric acid (HCl), nitric acid ($HNO_3$), or aqua regia may be used to remove the ion implantation mask.

In step P105A, the manufacturer forms a cap layer on the through film.

Figure 13:
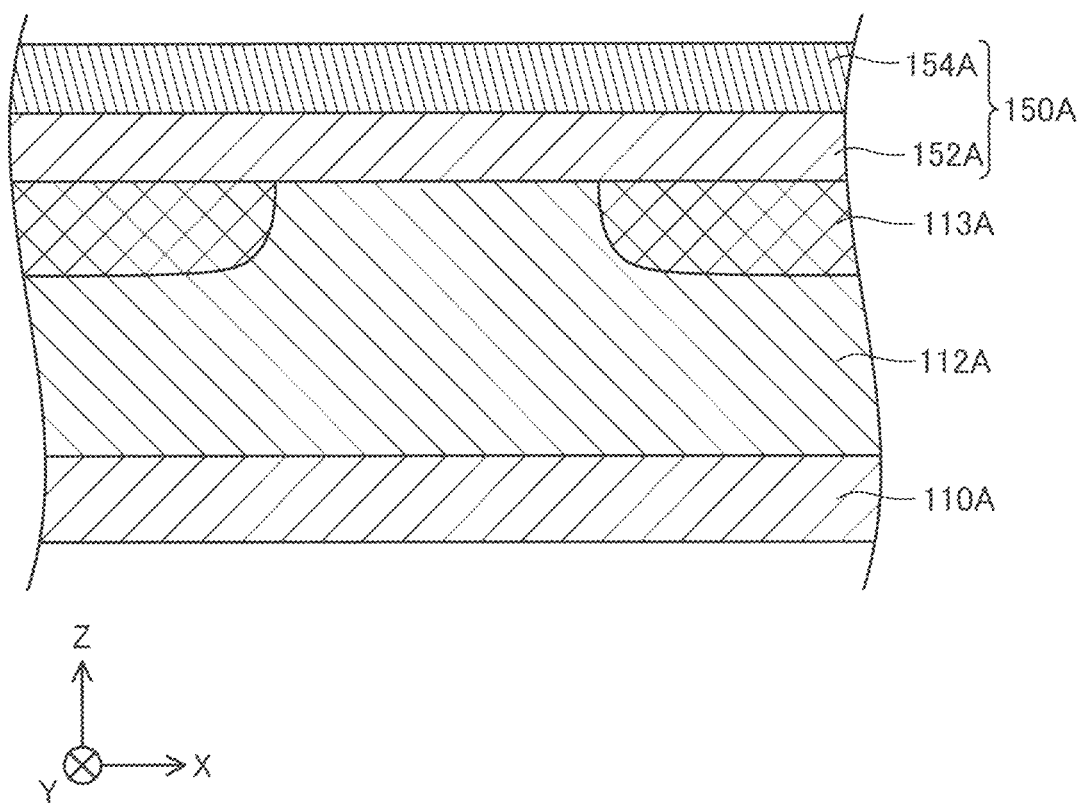
FIG. 13 is a schematic diagram showing a state after formation of a cap layer.

FIG. 13 is a schematic diagram showing a state after formation of the cap layer. In FIG. 13, the cap layer 154A formed on the through film 152A is made of amorphous aluminum nitride (AlN) in this embodiment. In this embodiment, the cap layer 154A is formed by metal organic chemical vapor deposition (MOCVD). Alternatively, the layer may be formed by a spattering method.

The through film 152A and the cap layer 154A serve as a cap layer 150A that covers the ion-implanted region 113A in a first thermal annealing step described later. Preferably, the cap layer 150A is made of at least one selected from the group consisting of aluminum nitride (AlN), silicon nitride ($Si_3N_4$), silicon dioxide ($SiO_2$), and aluminum oxide ($Al_2O_3$). In this embodiment, the cap layer 150A is made of amorphous aluminum nitride (AlN). In this embodiment, the thickness of the cap layer 154A ranges from 1 to 1,000 nm, inclusive.

Next, in step P106A, the manufacturer applies a thermal annealing to the ion-implanted region 113A, into which the p-type impurities are ion-implanted, in the state of being covered with the cap layer 150A, in an atmosphere containing nitrogen (N). Step P106A is also called the first thermal annealing step. In a state shown in FIG. 13, the first thermal annealing step is executed.

The thermal annealing temperature in the first thermal annealing step ranges from 1,150 to 1,250° C., inclusive. Preferably, the thermal annealing time in the first thermal annealing step ranges from 1 sec. to 10 min., inclusive. More preferably, this time ranges from 1 sec. to 1 min., inclusive. Preferably, the pressure in the first thermal annealing step ranges from 10 to 110 kPa, inclusive. In this embodiment, the thermal annealing temperature is 1,250° C., the thermal annealing time is 30 sec., and the pressure is 100 kPa. The application of the first thermal annealing step activates the p-type impurities in the ion-implanted region 113A, and achieves a high hole concentration.

Next, in step P107A, the manufacturer forms the etching mask on the cap layer 150A. In this embodiment, the etching mask is made of photoresist. An opening is provided so that an upper part of the ion-implanted region 113A in the cap layer 150A can be exposed. Instead of the photoresist, for example, an insulating film, a metal film, or a structure in which an insulating film and a metal film are stacked, may be adopted.

In step P108A, the manufacturer removes a part of the cap layer 150A. More specifically, the manufacturer removes the upper part of the ion-implanted region 113A in the cap layer 150A. In this embodiment, the manufacturer performs wet etching using tetramethylammonium hydroxide (TMAH) at a temperature ranging from 65 to 85° C., inclusive, and at pH 12. Instead of wet etching, dry etching may be used. In step P108A, the surface of the ion-implanted region 113A (the surface on the +Z-axis direction side) is exposed.

In step P109A, the manufacturer removes the etching mask.

Figure 14:
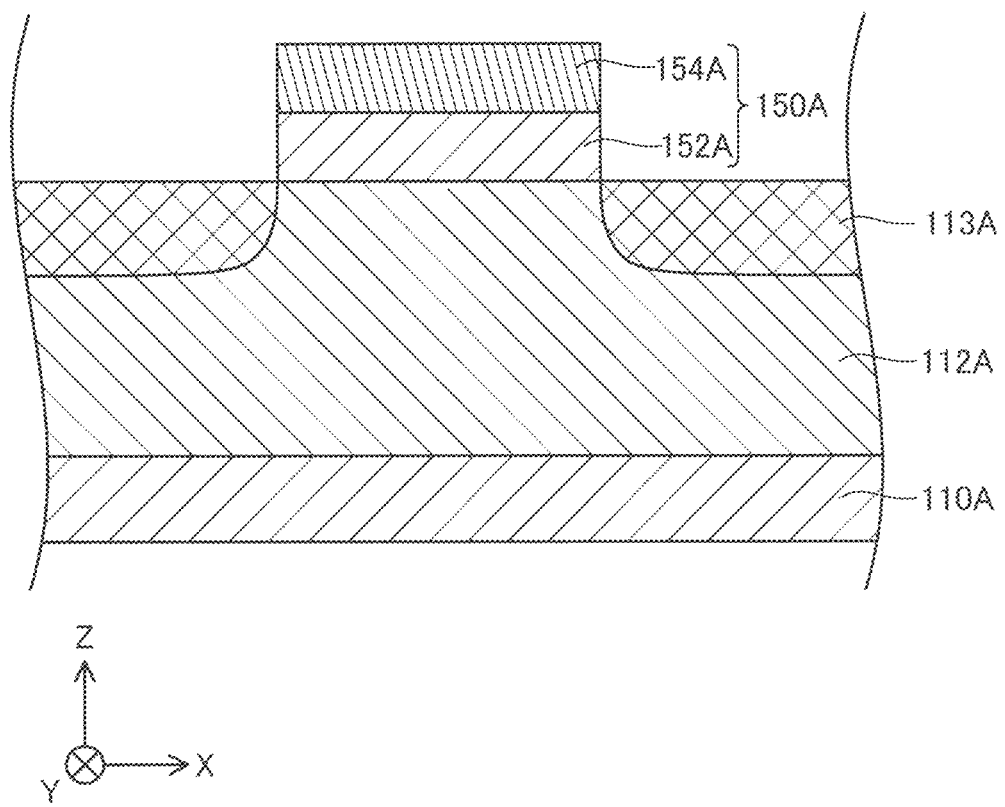
FIG. 14 is a schematic diagram showing a state after removal of an etching mask.

FIG. 14 is a schematic diagram showing a state after removal of the etching mask. In this embodiment, the etching mask, which is a photoresist mask, is removed by organic solvent. In the case where an insulating film is used as the etching mask, for example, hydrogen fluoride (HF) or ammonium hydrogen fluoride ($NH_4F$) may be used to remove the etching mask. In the case where a metal film is used as the ion implantation mask, for example, hydrochloric acid (HCl), nitric acid ($HNO_3$), or aqua regia may be used to remove the etching mask.

In step P110A, the manufacturer applies a thermal annealing in a state where the ion-implanted region 113A is exposed, in an atmosphere containing at least one of ammonia ($NH_3$) and hydrazine ($N_2H_4$), and hydrogen (H). Step P110A is also called a second thermal annealing step. In a state shown in FIG. 14, the second thermal annealing step is executed.

Preferably, the thermal annealing temperature in the second thermal annealing step is lower than the thermal annealing temperature in the first thermal annealing step. Preferably, this temperature ranges from 850 to 1,000° C., inclusive. Preferably, the thermal annealing time in the second thermal annealing step is longer than the thermal annealing time in the first thermal annealing step. Preferably, the time ranges from 30 to 90 min., inclusive. Preferably, the pressure in the second thermal annealing step ranges from 10 to 110 kPa, inclusive. In this embodiment, the thermal annealing temperature is 900° C., the thermal annealing time is 60 min., and the pressure is 100 kPa. Application of the second thermal annealing step eliminates or suppress pits on the surface of the ion-implanted region 113A (the surface on the +Z-axis direction side), and forms atomic steps.

In step P111A, the manufacturer removes the remaining cap layer 150A. In this embodiment, the manufacturer performs wet etching using tetramethylammonium hydroxide (TMAH) at a temperature ranging from 65 to 85° C., inclusive, and at pH 12. Instead of wet etching, dry etching may be used. In step P111A, the n-type semiconductor layer 112A having not been subjected to ion implantation is exposed.

In step P112A, the manufacturer forms the p-type semiconductor layers 114A containing p-type impurities, and the n-type semiconductor layers 116A containing n-type impurities, in this order, on the ion-implanted regions 113A. More specifically, the manufacturer forms the p-type semiconductor layers 114A and the n-type semiconductor layers 116A, in this order, on the n-type semiconductor layer 112A and the ion-implanted regions 113A. Preferably, the p-type semiconductor layer 114A is formed by at least one of the metal organic chemical vapor deposition (MOCVD) and molecular beam epitaxy (MBE). In this embodiment, the p-type semiconductor layer 114A and the n-type semiconductor layer 116A are formed by the metal organic chemical vapor deposition.

In step P113A, the manufacturer forms the trench 122A and the recesses 124A through dry etching. Subsequently, in step P114A, the manufacturer forms the insulating film 130A by the atomic layer deposition (ALD). Instead of the atomic layer deposition, the spattering method may be used.

In step P115A, the manufacturer forms the gate electrode 142A, the body electrodes 144A, the source electrodes 146A, and the drain electrode 148A. Through these steps, the semiconductor device 100A is completed.

D-3. Advantageous Effects

The manufacturing method according to the fourth embodiment described above includes the ion implantation step (step P103A), the first thermal annealing step (step P106A), and the second thermal annealing step (step P110A). Accordingly, the hole concentration in the ion-implanted regions 113A is improved, the atomic steps are formed on the surfaces of the ion-implanted regions 113A, and occurrence of pits on the surfaces of the ion-implanted regions 113A is suppressed. This mechanism may be as follows. That is, the cumulative dose in the ion implantation step ranges from $1.0 \times 10^{13}$ to $5.0 \times 10^{15}$ $cm^{-2}$, inclusive, which is smaller than the conventional cumulative dose. Consequently, it can be considered that the damage on the surface of the ion-implanted region due to ion implantation is reduced. Furthermore, the thermal annealing temperature in the first thermal annealing step ranges from 1,150 to 1,250° C., inclusive. Consequently, it can be considered that the hole concentration in the ion-implanted regions 113A is improved. Furthermore, the second thermal annealing step is included. Consequently, the atomic steps are formed on the surfaces of the ion-implanted regions 113A, and it can be considered that occurrence of pits on the surfaces of the ion-implanted regions 113A is suppressed. The results of evaluation tests that support such an advantageous effect are described below.

D-4. Test Result

FIG. 15 is a diagram showing results of evaluation tests. The following samples were used for an evaluation test. More specifically, the tester fabricated preproduction samples with different cumulative doses in ion implantation and different conditions in the first thermal annealing step, as preproduction samples 1 to 4, according to the manufacturing method described above. The conditions for the preproduction samples 1 to 4 are described below. The condition of the second thermal annealing step is that the thermal annealing temperature is 900° C. and the thermal annealing time is 60 min.

Preproduction sample 1
Cumulative dose: $2.3 \times 10^{15}$ $cm^{-2}$
Thermal annealing temperature: 1,200° C.
Thermal annealing time: 1 sec.
Preproduction sample 2
Cumulative dose: $2.3 \times 10^{14}$ $cm^{-2}$
Thermal annealing temperature: 1,250° C.
Thermal annealing time: 30 sec.
Preproduction sample 3
Cumulative dose: $2.3 \times 10^{15}$ $cm^{-2}$
Thermal annealing temperature: 1,300° C.
Thermal annealing time: 1 sec.
Preproduction sample 4
Cumulative dose: $2.3 \times 10^{15}$ $cm^{-2}$
Thermal annealing temperature: 1,300° C.
Thermal annealing time: 30 sec.

FIG. 15 shows (i) an atomic force microscope (AFM) image after the first thermal annealing step, (ii) the hole concentration and the pit density after the first thermal annealing step, (iii) an atomic force microscope image after the second thermal annealing step, and (iv) the hole concentration and the pit density after the second thermal annealing step, in each preproduction sample. The tester measures the hole concentration by the Hall effect measurement method. The tester calculates the pit density by counting the number of black dots in an image obtained through the atomic force microscope.

The result in FIG. 15 shows the followings. With respect to the hole concentration after the first thermal annealing step and the hole concentration after the second thermal annealing step, the preproduction samples 1 to 4 are compared with each other. The comparison shows that the hole concentration does not necessarily increase as the thermal annealing temperature in the first thermal annealing becomes high or low. In the case of the preproduction sample 2 (1,250° C. and 30 sec.), the hole concentration is the maximum.

Meanwhile, as to the pit density, it can be shown that the pit density after the first thermal annealing step is high in every preproduction sample, while the second thermal annealing step reduces the pit density. Furthermore, it can be shown that in the preproduction samples 1 and 2 where the first thermal annealing temperature ranges from 1,150° C. to 1,250° C., the hole concentration in the ion-implanted region is improved while no pit is formed. Furthermore, it can be shown that in the preproduction samples 1 and 2 where the first thermal annealing temperature ranges from 1,150° C. to 1,250° C., inclusive, wavy-line-shaped atomic steps were identified in atomic force microscope images after the second thermal annealing step, while the steps were not identified in the preproduction samples 3 and 4.

FIG. 16 is a diagram showing results of evaluation tests. The following samples were used for an evaluation test. More specifically, the tester used the preproduction sample 2 used in FIG. 15, and the preproduction sample 6 fabricated through a method identical to that of the preproduction sample 2 except in that the first thermal annealing step was not performed.

FIG. 16 shows (i) an atomic force microscope (AFM) image after the first thermal annealing step, (ii) the hole concentration and the pit density after the first thermal annealing step, (iii) an atomic force microscope image after the second thermal annealing step, and (iv) the hole concentration and the pit density after the second thermal annealing step, in each preproduction sample. The results in FIG. 16 shows that in the case without application of the first thermal annealing, the hole concentration was not improved.

E. Other Embodiments

The present disclosure is not limited to the embodiments described above, but can be achieved with various configurations in a scope without departing from the spirit thereof. For example, the technical characteristics in the embodiments, exemplary embodiments, and modifications corresponding to the technical characteristics in each aspect described in SUMMARY OF THE DISCLOSURE can be appropriately replaced or combined in order to solve a part of or the entire problems described above or achieve a part of or the entire advantageous effects described above. If the technical characteristics are not described as necessary items in this specification, the items can be appropriately removed.

In the embodiments described above, the materials of the substrates and the semiconductor layers are not necessarily limited to the gallium nitride (GaN). Alternatively, the materials may be gallium nitride (GaN) formed on sapphire ($Al_2O_3$). The materials of the substrate and the semiconductor layer may be, for example, another group-III nitride, such as aluminum nitride (AlN), and may be silicon (Si), silicon carbide (SiC), gallium oxide ($Ga_2O_3$), gallium arsenide (GaAs), diamond (C), etc.

The semiconductor device to which the fourth embodiment is applied is not limited to the vertical trench MOSFET and the vertical Schottky barrier diode described in the aforementioned embodiments. For example, the device may be an insulated gate bipolar transistor (IGBT), MESFET (metal-semiconductor field effect transistor) or the like.

What is claimed is:

1. A method of manufacturing a semiconductor device, comprising:
   an ion implantation step of ion-implanting p-type impurities by a cumulative dose D into an n-type semiconductor layer containing n-type impurities; and
   a thermal annealing step of annealing an ion-implanted region of the n-type semiconductor layer where the p-type impurities are ion-implanted in an atmosphere containing nitrogen at a temperature T for a time t,
   wherein the cumulative dose D [$cm^{-2}$], the temperature T [° C.], and the time t [min.] satisfy a following formula (1), $$D \le \left\{ \frac{t}{9 \times 10^{-34} \times \exp(-0.031 \times T)} \right\}^{0.3}, \quad (1)$$

and
   wherein the cumulative dose D is in a range from $1.0 \times 10^{14}$ $cm^{-2}$ to $1.0 \times 10^{15}$ $cm^{-2}$.
   wherein a pressure in the thermal annealing step ranges from 10 to 110 kPa.

2. The method of manufacturing the semiconductor device according to claim 1, the p-type impurities include at least one selected from the group consisting of magnesium, beryllium, and calcium.

3. The method of manufacturing the semiconductor device according to claim 1, wherein an implantation temperature of the ion implantation step ranges from 20° C. to 900° C.

4. The method of manufacturing the semiconductor device according to claim 1, wherein an implantation angle in the ion implantation step ranges from 0° to 15°.

5. The method of manufacturing the semiconductor device according to claim 1, wherein a nitrogen source in the thermal annealing step is of at least one selected from the group consisting of nitrogen, ammonia, and hydrazine.

6. The method of manufacturing the semiconductor device according to claim 1, further comprising:
   before the ion-implanting of the p-type impurities, forming a through film on the n-type semiconductor layer, the ion-implanting of the p-type impurities comprising ion-implanting the p-type impurities in the through film such that the through film adjusts a distribution of concentration of the p-type impurities to be implanted in the n-type semiconductor layer; and
   after the ion-implanting of the p-type impurities, forming a cap layer on the through film, the annealing of the ion-implanted region being performed in a state that the cap layer covers the ion-implanted region.

7. The method of manufacturing the semiconductor device according to claim 1, wherein the ion-implanting of the p-type impurities comprises setting the cumulative dose D based on a desired hole concentration, and
   wherein the annealing of the ion-implanted region comprises setting the temperature T and the time t so as to satisfy the Formula (1).

8. A method of manufacturing a semiconductor device, comprising:

setting a cumulative dose D [cm$^{-2}$] based on a desired hole concentration;

ion-implanting p-type impurities by the cumulative dose D into an n-type semiconductor layer including n-type impurities, an implantation temperature of the ion implanting p-type impurities being in a range from 20° C. to 900° C.; and thermally annealing an ion-implanted region of the n-type semiconductor layer where the p-type impurities are ion-implanted in an atmosphere containing nitrogen at a temperature T [° C.] and for a time t [min.] that satisfy a following formula (1) for the set cumulative dose D, $$D \leq \left\{ \frac{t}{9 \times 10^{-34} \times \exp(-0.031 \times T)} \right\}^{0.3}, \quad (1)$$

wherein a pressure in the thermally annealing the ion-implanted region ranges from 10 kPa to 110 kPa.

* * * * *